(12) United States Patent
Tran

(10) Patent No.: US 6,456,131 B1
(45) Date of Patent: Sep. 24, 2002

(54) CHARGE MIRROR CIRCUIT

(75) Inventor: Hiep V. Tran, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/708,751

(22) Filed: Nov. 8, 2000

Related U.S. Application Data

(60) Provisional application No. 60/168,339, filed on Dec. 1, 1999.

(51) Int. Cl.$^7$ ................................................ H03L 7/06
(52) U.S. Cl. ........................................ 327/157; 327/159
(58) Field of Search ................................. 327/148, 150, 327/155, 157, 159, 91, 94

(56) References Cited

U.S. PATENT DOCUMENTS

| | | | | |
|---|---|---|---|---|
| 3,777,276 A | | 12/1973 | Klein | |
| 4,750,193 A | * | 6/1988 | Bailey | 327/157 |
| 5,473,275 A | * | 12/1995 | Hughes et al. | 327/336 |
| 5,473,283 A | * | 12/1995 | Luich | 327/157 |
| 5,793,231 A | * | 8/1998 | Whittaker | 327/95 |
| 5,912,575 A | * | 6/1999 | Takikawa | 327/157 |

* cited by examiner

*Primary Examiner*—Terry D. Cunningham
(74) *Attorney, Agent, or Firm*—J. Dennis Moore; W. James Brady III; Frederick J. Telecky, Jr.

(57) ABSTRACT

A charge pump circuit. The circuit includes an input node for receiving a clock signal having cycles. The charge pump circuit includes a pump circuit coupled to the input node, including a first capacitor and having an output node coupled to a second capacitor, the pump circuit operating to provide a predetermined charge the second capacitor in response to a cycle of the clock signal. The predetermined charge corresponds to the amount of charge accumulated on the first capacitor during the cycle of the clock signal.

1 Claim, 2 Drawing Sheets

CHARGE MIRROR CIRCUIT

This application claims priority under 35 U.S.C. § 119(e)(1) of provisional application No. 60/168,339 filed Dec. 01, 1999.

TECHNICAL FIELD OF THE INVENTION

This invention relates to electronic circuits for controlling voltage, and more particularly relates to low power circuits for controlling voltage.

BACKGROUND OF THE INVENTION

Numerous applications exist where it is necessary to have a controlled voltage and/or a constant voltage. In addition, low power consumption of circuits has in recent years become a matter of particular focus, as more and more electronic devices are being made portable, thereby having to rely on battery power. A number of circuits provide relatively low power controlled and/or constant voltage, but there is a need for improvement in gate count and overall power consumption.

SUMMARY OF THE INVENTION

The present invention provides a charge pump circuit. The circuit includes an input node for receiving a clock signal having cycles. The charge pump circuit includes a pump circuit coupled to the input node, including a first capacitor and having an output node coupled to a second capacitor, the pump circuit operating to provide a predetermined charge the second capacitor in response to a cycle of the clock signal. The predetermined charge corresponds to the amount of charge accumulated on the first capacitor during the cycle of the clock signal.

These and other features of the invention will be apparent to those skilled in the art from the following detailed description of the invention, taken together with the accompanying drawings.

DETAILED DESCRIPTION OF THE PREFERRED EMBODIMENT

Figure 1:
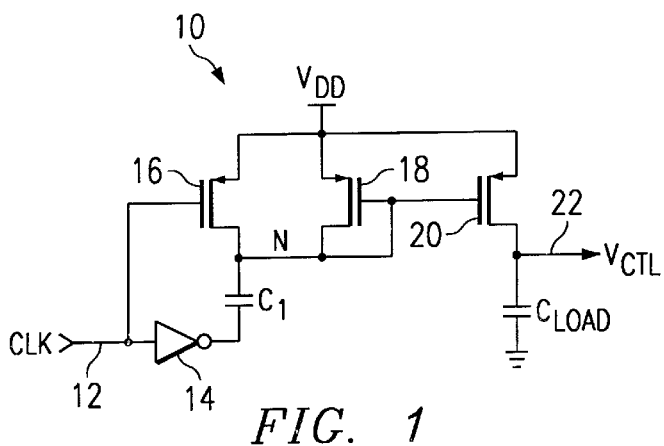
FIG. 1 is a circuit diagram of a first preferred embodiment of the present invention.

FIG. 1 is a circuit diagram of a circuit 10 according to a first preferred embodiment of the present invention. Circuit 10 receives a clock signal CLK, for example a square wave clock signal, such as clock signal 24 shown in FIG. 2, on an input line 12. Input line 12 is connected to the input of an inverter 14 and to the gate of a first p-channel MOS transistor 16. The source of MOS transistor 16 is connected to a positive voltage source $V_{DD}$. The output of inverter 14 is connected to one plate of a first capacitor $C_1$, while the drain of MOS transistor 16 is connected to a second plate of capacitor $C_1$.

The common connection node of capacitor $C_1$ and MOS transistor 16, labeled node N in the figure, is connected to the drain and gate of a second p-channel MOS transistor 18, the source of which is connected to voltage source $V_{DD}$. Node N is also connected to the gate of a third p-channel MOS transistor 20. The source of MOS transistor 20 is connected to voltage source $V_{DD}$, and the drain of MOS transistor 20 is connected to one plate of a load capacitor $C_{LOAD}$. The other plate of capacitor $C_{LOAD}$ is connected to ground. An output line 22 is connected to the common connection node of capacitor $C_{LOAD}$ and carries a controlled output voltage $V_{CTL}$.

Figure 2:
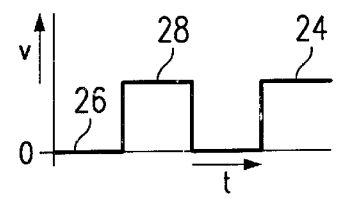
FIG. 2 is a signal diagram showing an example of a clock signal usable as CLK in FIG. 1.

The operation of circuit 10 will now be explained, with reference to FIG. 1 and FIG. 2. FIG. 2 is a signal diagram showing an example of a clock signal usable as CLK in FIG. 1. The horizontal axis represents time, while the vertical axis represents signal level. The clock signal has repeating cycles. During a low phase 26 (FIG. 2) of a cycle of CLK the output of inverter 14 is driven high, while MOS transistor 16 is turned ON, which causes the voltage across capacitor $C_1$ to go to zero, thus causing the discharge of capacitor $C_1$. During a high phase 28 (FIG. 2) of a cycle of CLK the output of inverter 14 is driven low, while MOS transistor 16 is turned OFF. This pulls node N low, causing a current to flow through capacitor $C_1$ and MOS transistor 18. Node N is held near $V_{DD}-V_t$, where $V_{DD}$ is the voltage level of voltage source $V_{DD}$, and $V_t$ is the transistor threshold voltage of MOS transistor 18.

This current charges capacitor $C_1$ up, and as it charges up, the current diminishes. The current is thus limited. Also, this current through MOS transistor 18 is mirrored in MOS transistor 20, charging up capacitor $C_{LOAD}$. In effect, a charge transfer occurs from capacitor $C_1$ to capacitor $C_{LOAD}$. When the voltage across capacitor $C_1$ reaches $V_{DD}-V_t$, the current through MOS transistor 18 stops. The charge transfer is complete when the current through MOS transistor 20 stops. Thus, a principle similar to that of a CMOS current mirror is utilized. However, instead of current flow, the charge from one branch of the circuit 10 is transferred to the other branch. The charge transferring event happens once every period of CLK.

The transferred charge can be estimated as:

$$Q_t = (V_{DD} - V_t)\frac{S2}{S1}C_1 \qquad \text{Equation (1)}$$

where Qt is the transferred charge, $C_1$ is the capacitance of capacitor $C_1$, and $$\frac{S2}{S1}$$

is the ratio of the size of the mirror transistor pair MOS transistor 18/MOS transistor 20. In determining the size ratio it is assumed that the channel length is the same, and the ratio is the ratio of the widths of the transistor channels.

Circuit 10 is a very low power circuit that may be used to provide a controlled or constant voltage $V_{CTL}$. The principles utilized in circuit 10 may be used to provide a low/high limit circuit in a phase locked loop circuit (PLL). Those principles may also be used to provide a kick-start circuit for a PLL. In addition, those principles may be used to provide a charge pump.

Figure 3:
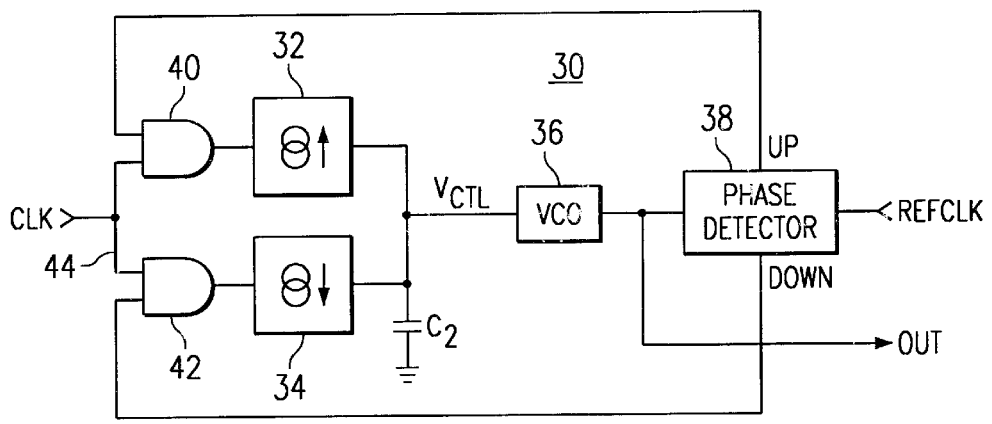
FIG. 3 is a block diagram of a circuit diagram of a second preferred embodiment of the present invention.

FIG. 3 is a block diagram of a PLL 30 in which the principles of the present invention are used, according to a second preferred embodiment of the present invention. A pull-up charge mirror 32 and a pull-down charge mirror 34 are used to control the voltage $V_{CTL}$ on a load capacitor $C_2$. Capacitor $C_2$ has one plate connected to the outputs of both charge mirror 32 and charge mirror 34. The other plate of capacitor $C_2$ is connected to ground. The voltage $V_{CTL}$ is applied to the control input of a voltage controlled oscillator (VCO) 36. The output of the VCO 36 is applied to the input of a phase detector 38 having an UP output and a DOWN output for signaling that the frequency of the VCO 36 needs to increase (UP) or decrease (DOWN), respectively. The UP output is connected to one input of a first two-input AND gate 40, while the DOWN output is connected to one input of a second two-input AND gate 42. The other input of AND gates 40 and 42 is connected to an input line 44, which has a CLK input bearing a clock signal, such as the clock signal 24 shown in FIG. 2. The outputs of AND gates 40 and 42 are connected to the inputs of charge mirror 32 and charge mirror 34, respectively.

The PLL 30 operates as follows. The VCO 36 oscillates at a frequency approximately the same as the desired frequency of the output of the PLL 30. The phase detector 38 receives the oscillating signal VCO 36 output-and an oscillating signal reference clock REFCLK, and compares the two. Depending on the relative phase difference between the VCO 36 output and the reference clock, the phase detector 38 signals that the frequency of the VCO 36 needs to increase (UP) or decrease (DOWN), as described above. The output OUT of the VCO 36 is the output of the PLL 30. An UP signal is applied to one input of AND gate 40, and enables the CLK signal to be provided to charge mirror 32, while a DOWN signal is applied to one input of AND gate 42, and enables the CLK signal to be provided to charge mirror 34. Application of the CLK signal to charge mirror 32 activates it to pump charge onto the "top" plate of capacitor $C_2$, that is, the plate of capacitor $C_2$ common with the input of VCO 36. Application of the CLK signal to charge mirror 34 activates it to pump charge from the top plate of capacitor $C_2$. In this way the voltage $V_{CTL}$ is controlled with a very low power consumption.

Note that the two clocks CLK and REFCLK are unrelated in function, and need not be the same frequency. However, they can be the same clock signal. The clock CLK serves to activate the charge pumps 32 and 34, while REFCLK serves to provide a reference frequency for the PLL 30.

Charge mirror 32 is constructed much like charge mirror 10 of FIG. 1, with capacitor $C_2$ serving the function capacitor $C_{LOAD}$ provides in charge mirror 10. Otherwise, charge mirror 32 is substantially the same in construction as charge mirror 10.

Figure 4:
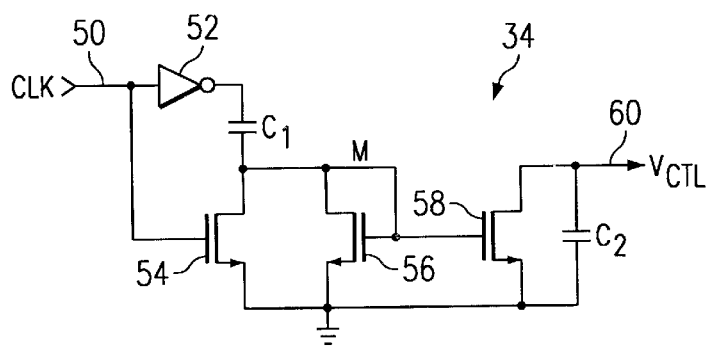
FIG. 4 is a circuit diagram of a third preferred embodiment of the present invention.

Charge mirror 34 is a third preferred embodiment of the present invention, and is constructed as shown in FIG. 4, wherein it can be seen that a nearly inverse construction is provided, as compared with the charge mirror 10 of FIG. 1. Thus, circuit 10 receives a clock signal CLK on an input line 50. Input line 50 is connected to the input of an inverter 52 and to the gate of a first n-channel MOS transistor 54. The source of MOS transistor 54 is connected to a ground. The output of inverter 50 is connected to one plate of a first capacitor $C_1$, while the drain of MOS transistor 54 is connected to a second plate of capacitor $C_1$.

The common connection node of capacitor $C_1$ and MOS transistor 54, labeled node M in the figure, is connected to the drain and gate of a second n-channel MOS transistor 56, the source of which is connected to ground, and to the gate of a third n-channel MOS transistor 58. The source of MOS transistor 20 is connected to ground, and the drain of MOS transistor 20 is connected to one plate of load capacitor $C_2$. The other plate of capacitor $C_2$ is connected to ground.

Operation of charge mirror 34 is likewise similar to that of charge mirror 32 of FIG. 3 and FIG. 1. Thus, referring now to FIG. 4 and to FIG. 2, during a high phase 28 (FIG. 2) of a cycle of CLK the output of inverter 52 is driven low, while MOS transistor 54 is turned ON, which causes the voltage across capacitor $C_1$ to go to zero, thus causing the discharge of capacitor $C_1$. During a low phase 26 (FIG. 2) of a cycle of CLK the output of inverter 52 is driven high, while MOS transistor 16 is turned OFF. This pulls node M high, causing a current to flow through capacitor $C_1$ and MOS transistor 56. Node M is held near ground $+V_t$, where $V_t$ is the transistor threshold voltage of MOS transistor 56. This current charges capacitor $C_1$ up, and as it charges up, the current diminishes. The current is thus limited. Also, this current through MOS transistor 56 is mirrored in MOS transistor 58, draining charge from capacitor $C_2$. In effect, an inverse charge transfer occurs between capacitor $C_1$ and capacitor $C_2$. When the voltage across capacitor $C_1$ reaches $V_{DD}-V_t$, such that node M is at $V_t$, the current through MOS transistor 18 stops. The inverse charge transfer is complete when the current through MOS transistor 56 stops. The inverse charge transferring event happens once every period of CLK.

Figure 5:
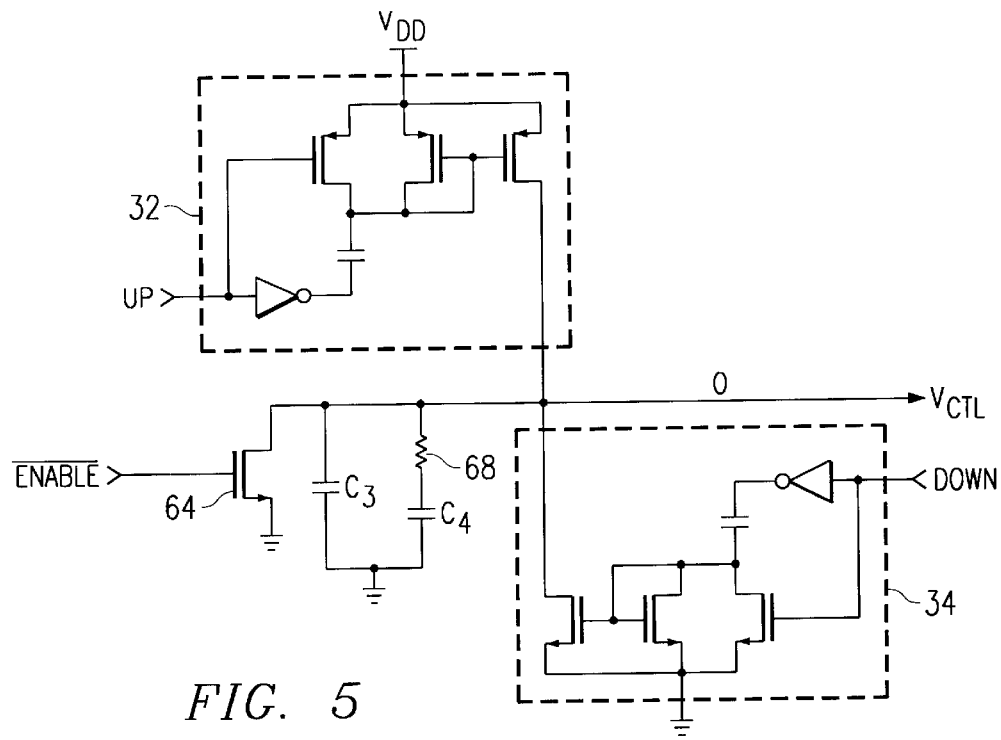
FIG. 5 is a circuit diagram of a fourth preferred embodiment of the present invention.

FIG. 5 is a circuit diagram showing details of the pull-up charge mirror 32 and pull-down charge mirror 34, connected together as in FIG. 3, and illustrates a fourth preferred embodiment of the present invention. In the circuit of FIG. 5, in the place of capacitor $C_2$ is a circuit made of capacitor $C_3$, capacitor $C_4$ and resistor 68. Resistor 68 and capacitor $C_4$ are connected in series between node O and ground, while capacitor $C_3$ is connected between node O and ground. This combination of elements replacing capacitor $C_2$ provides both the capacitive function of capacitor $C_2$ and the function of a second order filter that provides stability to the PLL 30 (FIG. 3).

Also shown in FIG. 5 is an enable circuit, made of an n-channel MOS transistor 64 having its source connected to ground, its drain connected to node O and its gate receiving an $\overline{\text{ENABLE}}$ signal. When the $\overline{\text{ENABLE}}$ signal is high, indicating a disable state, MOS transistor 64 is turned ON, pulling node O to ground, disabling the charge pumps 32 and 34. Conversely, when the $\overline{\text{ENABLE}}$ signal is low, indicating an enable state, MOS transistor 64 is turned OFF, allowing charge pumps 32 and 34 to provide their charge pumping function as described hereinabove.

Figure 6:
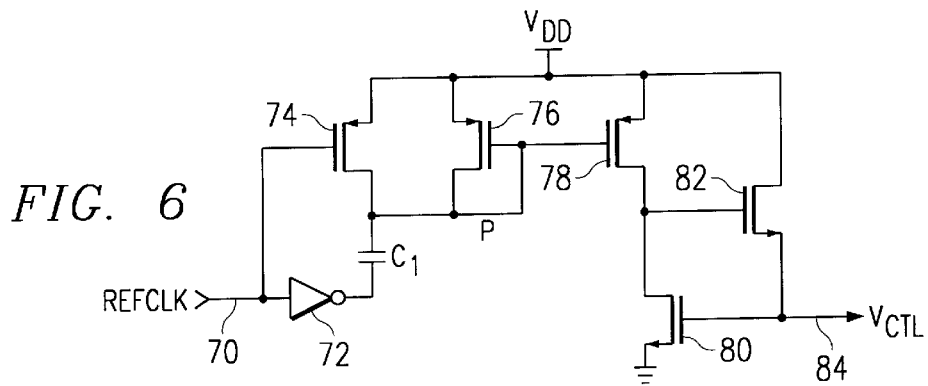
FIG. 6 is a circuit diagram of a fifth preferred embodiment of the present invention.

FIG. 6 is a kick-start circuit, according to a fifth preferred embodiment of the present invention. As is known, a kick-start circuit usually turns on to set a critical voltage on start-up of another circuit, to "kick" the other circuit out of an undesired stability mode into a desired stability mode, and then turns off so as to prevent interference with the normal operation of the other circuit. The kick-start circuit of FIG. 6 may be used, for example, in conjunction with the PLL 30 of FIG. 3 to kick the PLL 30 out of a start-up state in which VCO 36 is in a stable, non-oscillatory state, and phase detector 38 generates no phase difference signal. This stability mode tends to keep $V_{CTL}$ at low voltage, and VCO 36, therefore, off. The presence of the reference clock REFCLK, described hereinabove in conjunction with FIG. 3, is used to generate a temporary voltage at the input of VCO 36, which is removed once sufficient $V_{CTL}$ voltage is generated to turn VCO 36 on, thus start the PLL 30.

In FIG. 6 the REFCLK signal is provided on an input line 70 to the input of an inverter 72 and to the gate of an p-MOS transistor 74. The source of MOS transistor 74 is connected to $V_{DD}$. The output of inverter 70 is connected to one plate of a first capacitor $C_1$, while the drain of MOS transistor 74 is connected to a second plate of capacitor $C_1$.

The common connection node of capacitor $C_1$ and MOS transistor 74, labeled node P in the figure, is connected to the drain and gate of a second p-channel MOS transistor 76, the source of which is connected to $V_{DD}$. Node P is also connected to the gate of a third p-channel MOS transistor 78. The source of MOS transistor 78 is connected to $V_{DD}$, and the drain of MOS transistor 78 is connected to the drain of a first n-channel MOS transistor 80 and to the gate of a second n-channel MOS transistor 82. The drain of MOS transistor 82 is connected to $V_{DD}$, while its source is connected to the gate of MOS transistor 80, the common connection node of the source of MOS transistor 82 and the gate of MOS transistor 80 being the output line 84 which may be connected, e.g., to the node carrying the control signal $V_{CTL}$ in FIG. 3 (or, node O in FIG. 5). The source of MOS transistor 80 is connected to ground.

FIG. 6 operates according to the same general principles as the circuit 10 of FIG. 1. Thus, inverter 72, capacitor $C_1$, MOS transistor 74, MOS transistor 76 and MOS transistor 78 of FIG. 6 operate in essentially the same manner as inverter 14, capacitor $C_1$, MOS transistor 16, MOS transistor 18 and MOS transistor 20 of FIG. 1. The load capacitance in FIG. 6 corresponding to $C_{LOAD}$ in FIG. 1 is the parasitic capacitance seen at the gate of MOS transistor 82. As the charge pump adds charge to that parasitic capacitance, the voltage on the gate of MOS transistor 82 rises, turning MOS transistor 82 on. When MOS transistor 82 is turned on output line 84 is pulled high, thus providing the desired kick-start voltage to, e.g., start PLL 30 (FIG. 3). However, as the voltage on output line 84 goes high, so also does the voltage on the gate of MOS transistor 80. This turns MOS transistor 80 on, which pulls the gate of MOS transistor 82 low, turning it off, and thus removing the kick-start voltage from output line 84 and preventing interference with the normal operation of the circuit to which it is connected.

Figure 7:
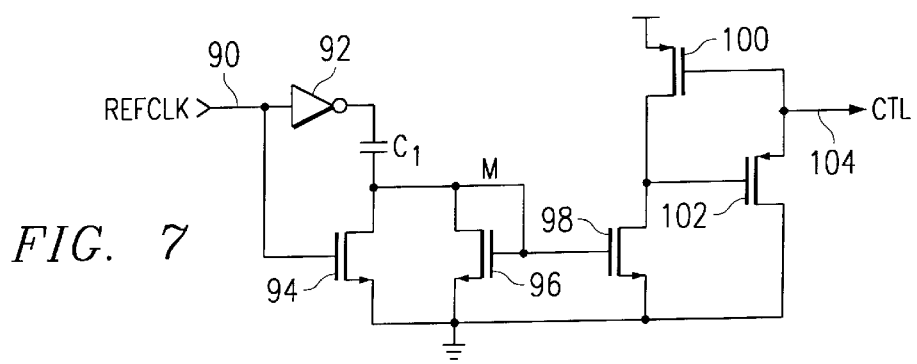
FIG. 7 is a circuit diagram of a sixth preferred embodiment of the present invention.

FIG. 7 is another kick-start circuit, according to a sixth preferred embodiment of the present invention. This circuit provides a kick-start voltage of opposite polarity, as compared with the kick-start voltage provided by the circuit of FIG. 6. Thus, output line 104 is provided with a negative kick-start voltage to, e.g., kick it out of an undesired stability mode in which the voltage on output line 104 is high. After providing the negative kick-start voltage, the circuit turns itself off, preventing interference with the normal operation of the circuit to which it is connected. The circuit of FIG. 7 operates according to the same general principles as the charge mirror 34 of FIG. 4, with the parasitic capacitance seen at the gate of MOS transistor 102 serving as the load capacitance, i.e., providing function corresponding to that of capacitor $C_2$ in FIG. 4. The charging up of this parasitic capacitance turns MOS transistor 102 on, providing the negative kick-start voltage to output line 104. The kick-start voltage then turns on MOS transistor 100, removing the kick-start voltage from output line 104 and preventing interference with the normal operation of the circuit to which it is connected.

Although the present invention and its advantages have been described in detail, it should be understood that various changes, substitutions and alterations can be made herein without departing from the spirit and scope of the invention as defined by the appended claims.

What is claimed is:

1. A charge pump circuit, comprising:

an input node for receiving a clock signal;

an inverter having an input coupled to said input node and having an output coupled to a first plate of a first capacitor;

a first MOS transistor having its gate coupled to said input node and having its source and drain being coupled between a first polarity terminal of a voltage source and a second plate of said first capacitor;

a second MOS transistor having its drain and gate coupled to a common connection node of said first MOS transistor and said first capacitor, and having its source coupled to said first polarity terminal of said voltage source; and a third MOS transistor having its gate coupled to said common connection node of said first MOS transistor and said first capacitor, having its source coupled to said first polarity terminal of said voltage source, and having its drain coupled to a first plate of a second capacitor, a second plate of said second capacitor being coupled to a second polarity terminal of said voltage source, a common connection node of said third MOS transistor and said second capacitor providing a controllable voltage output.

* * * * *